United States Patent [19]

Maitland

[11] 4,261,464
[45] Apr. 14, 1981

[54] TOTE BOX FOR CARRYING DIFFERENT LENGTH CIRCUIT BOARDS

[75] Inventor: David E. Maitland, Canton, Mass.

[73] Assignee: C. R. Daniels, Inc., Ellicott City, Md.

[21] Appl. No.: 70,629

[22] Filed: Aug. 29, 1979

[51] Int. Cl.³ .................. B65D 85/30; B65D 5/48; B65D 57/00; A47G 19/08

[52] U.S. Cl. .................. 206/334; 220/22.3; 211/41

[58] Field of Search .................. 206/334, 328, 310; 220/21, 22, 22.3; 312/10; 211/41

[56] References Cited

U.S. PATENT DOCUMENTS

| | | | |
|---|---|---|---|
| 1,030,534 | 6/1912 | Pooler | 206/310 |
| 2,868,606 | 1/1959 | Stierna | 206/310 |
| 2,985,333 | 5/1961 | Kirkman | 220/22 |
| 3,014,594 | 12/1961 | Kerstner | 206/334 |
| 3,656,650 | 4/1972 | Frater | 220/21 |
| 4,099,623 | 7/1978 | Van Osdol | 211/41 |
| 4,143,763 | 3/1979 | Haglund | 206/334 |
| 4,155,447 | 5/1979 | Edwards | 206/334 |

*Primary Examiner*—William T. Dixson, Jr.
*Attorney, Agent, or Firm*—Stevens, Davis, Miller & Mosher

[57] ABSTRACT

A tote box includes two opposing side walls, and first grooves in one of the side walls and second grooves in the other side wall. The invention includes first and second locator members, each of which includes a planar body section having opposing faces, one of which is adapted to abut the interior side of the corresponding side walls. Each locator member also includes a pair of vertically extending tongues projecting from the one face of the body section and releasably positionable in any next adjacent pair of the first grooves and a plurality of vertically and inwardly extending substantially equally spaced apart tongues projecting from the other face of the body section. The latter tongues define a plurality of horizontally substantially equally spaced apart inwardly opening vertically extending grooves which are more clearly spaced apart than the first and second grooves.

A circuit board divider has grooves on both sides of it which face each of the end walls. One set of grooves on one side of the divider have their bottoms closer to the central plane of the divider than the other set by a distance less than the distance between the grooves in the locator members. As a result, the printed circuit board length accommodating distance between each of the end walls and the divider can be varied by rotating it so that the groove sets face the other end wall than the one they originally faced before rotation.

5 Claims, 8 Drawing Figures

TOTE BOX FOR CARRYING DIFFERENT LENGTH CIRCUIT BOARDS

CROSS-REFERENCE TO RELATED APPLICATION

This application relates to a tote box for carrying different length circuit boards of the type described and claimed in co-pending U.S. patent application Ser. No. 070,661 in the name of Theodore C. Thomas filed simultaneously with this application.

BACKGROUND OF THE INVENTION

1. Field of the Invention

This invention relates to a box for carrying articles of different lengths, and more particularly, to a tote box for carrying different length printed circuit boards.

2. Description of the Prior Art

Boxes have been provided for accommodating circuit boards of different lengths. However, in the prior art, in order to adjust for the different length circuit boards, the boxes included adjustable brackets lockable in various positions with fasteners such as nut and bolt assemblies. The brackets and nuts and bolts are made of metal, are costly, and structurally complex.

SUMMARY OF THE INVENTION

It is an object of applicant's invention to provide a tote box for carrying different length circuit boards which is structurally non-complex and has a minimum number of structural components.

It is a further object of applicant's invention to provide a tote box for carrying different length circuit boards which is easily adjustable to accommodate the different lengths.

It is a further object of applicant's invention to provide a tote box for carrying different length circuit boards which does not require the use of mechanical connectors, such as nuts and bolts and screws, to lock the parts of the box in adjusted position.

The above objects and others are obtained by providing a tote box for carrying different length printed circuit boards which includes two opposing side walls, two opposing end walls having inwardly opening vertically extending grooves therein, and a bottom. A first plurality of horizontally substantially equally spaced apart inwardly opening vertically extending grooves are provided in one of the side walls and a second plurality of similar grooves are provided in the other wall. The first and second grooves are mirror immages of each other relative to a vertical plane parallel to the side walls positioned midway therebetween. The invention includes first and second locator members, each of which includes a planar body section having opposing faces, one of which is adapted to abut the interior side of the corresponding side walls. Each locator member also includes a pair of vertically extending tongues projecting from the one face of the body section and releasably positionable in any next adjacent pair of the first grooves and a plurality of vertically and inwardly extending substantially equally spaces apart tongues projecting from the other face of the body section. The latter tongues define a plurality of horizontally substantially equally spaced apart inwardly opening vertically extending grooves which are more closely spaced apart than the first and second grooves.

A circuit board divider is releasably positionable in corresponding ones of the inwardly opening grooves in the first and second locator members to extend between them. The divider has a plurality of horizontally spaced vertically spaced extending grooves therein which cooperate with grooves in the end walls to releasably hold printed circuit boards therein. The divider has grooves on both sides of it which face each of the end walls. One set of grooves on one side of the divider have their bottoms closer to the central plane of the divider than the other set by a distance less than the distance between the grooves in the locator members. As a result, the printed circuit board length accommodating distance between each of the end walls and the divider can be varied by rotating it so that the groove sets face the other end wall than the one they originally faced before rotation. By adjusting the position of the locator members in the sidewalls and the position of the divider in the grooves on the locator members, the divider can be adjustably positioned to accommodate printed circuit boards of different lengths. By rotating the divider, an even finer adjustment can be made of the length accommodating distance between the divider and the end walls.

DESCRIPTION OF THE PREFERRED EMBODIMENT

Figure 1:
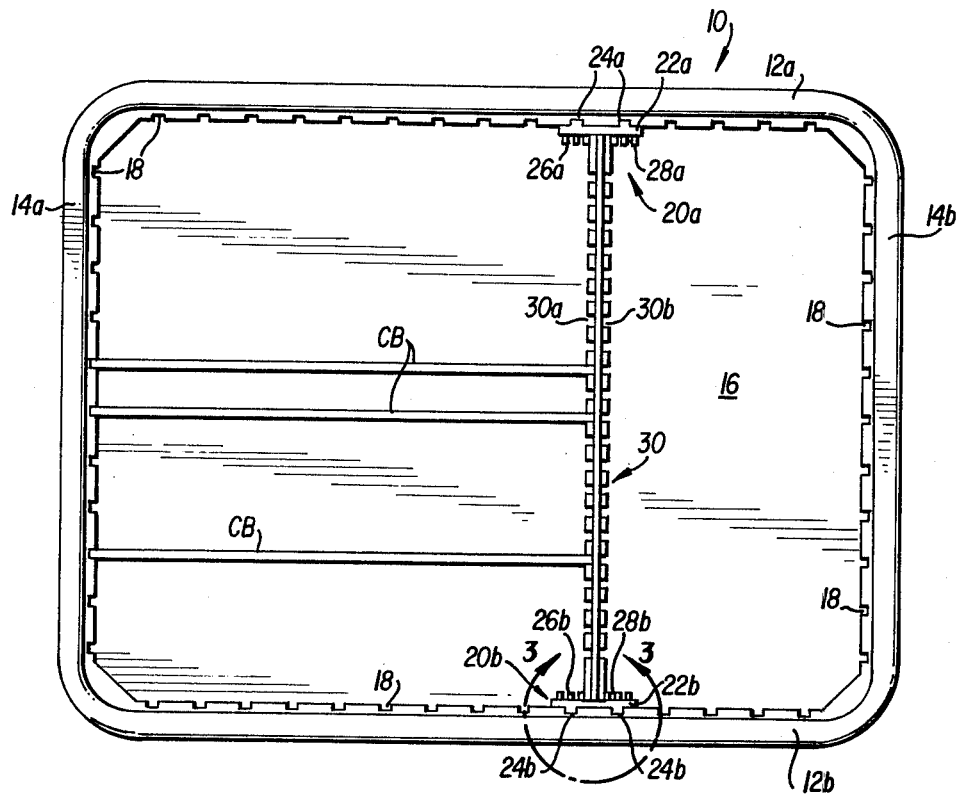
FIG. 1 is a plan view of the invention.
Figure 3:
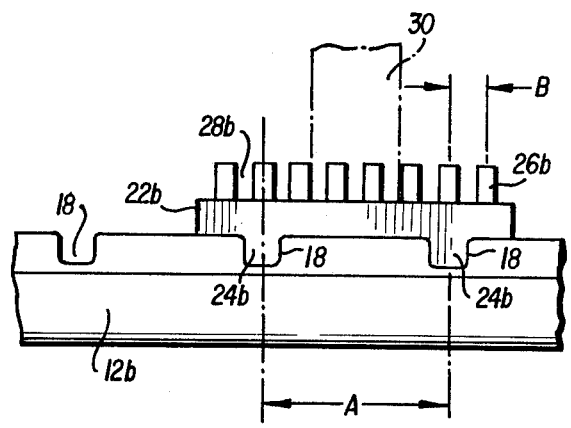
FIG. 3 is a detail of the components of the invention within the line 3—3 in FIG. 1.

Shown in FIG. 1 is a tote box 10 for carrying different length printed circuit boards CB. The box includes two opposing side walls 12a, 12b, two opposing end walls 14a, 14b, and a bottom 16. Defined in the walls 12a, 12b, 14a and 14b are a plurality of horizontally substantially equally space apart inwardly opening vertically extending grooves 18. In each of the walls, the grooves 18 are spaced center to center by a distance of for example 1 and ¼ or 1 and ½ inches. That center to center distance is designated "A" in FIG. 3.

The grooves 18 in the wall 12a and the grooves 18 in the wall 12b are mirror images of each other relative to a vertical plane parallel to the side walls 12a, 12b and positioned midway therebetween. Likewise, the grooves 18 in the end wall 14a and the grooves 18 in the end wall 14b are mirror images of each other relative to a vertical plane parallel to the end walls 14a, 14b and positioned midway therebetween.

The invention also includes first and second locator member 20a and 20b. The locator members respectively include a planar body section 22a, 22b having opposed faces, one of which is adapted to abut the interior side of the respective side wall 12a, 12b. Each locator member also respectively includes a pair of vertically extending tongues 24a, 24b which project from the one face of the respective body section and are releasably positionable in any next adjacent pair of the grooves 18 in the walls 12a, 12b. Each locator member also includes a plurality of vertically and inwardly extending substantially equally horizontally spaced apart second tongues 26a, 26b which project from the other face of the body section. The second tongues define a plurality of horizontally substantially spaced apart inwardly opening vertically extending grooves 28a, 28b. the plurality of grooves 28a and the plurality of grooves 28b are mirror images of each other relative to a vertical plan parallel to the walls 12a, 12b and positioned midway therebetween when the locator members 20a, 20b are positioned in corresponding ones of the grooves 18 in the walls 12a and 12b respectively.

Figure 2:
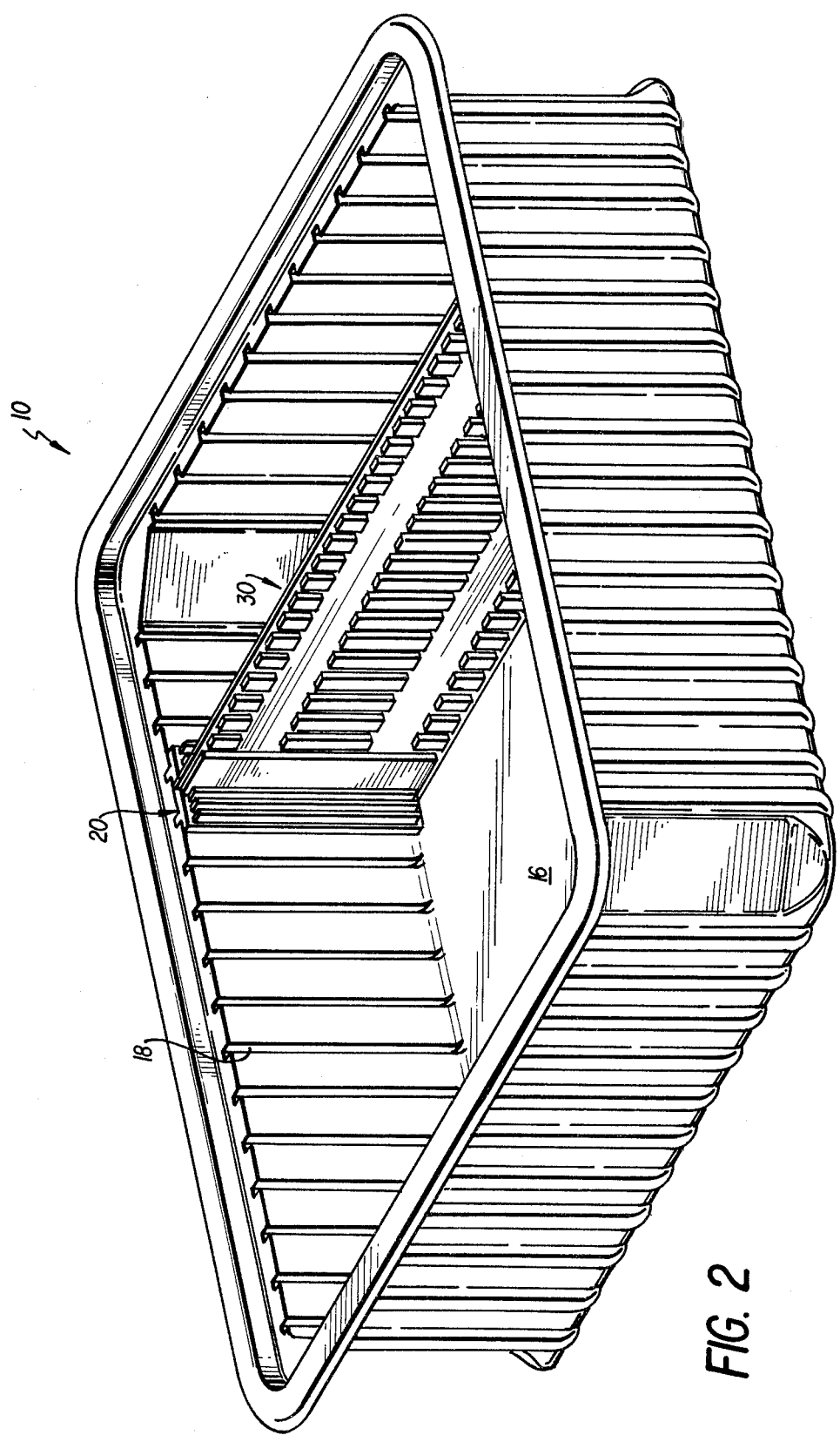
FIG. 2 is a perspective view of the invention.
Figure 5:
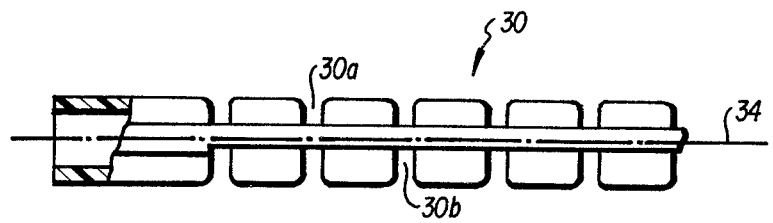
FIG. 5 is a plan view of an alternative embodiment of the invention.

As shown particularly in FIG. 2, the body section of each of the locator members 20a, 20b is substantially rectangular with vertical and horizontal edges. Each of the pairs of tongues 24a, 24b is spaced horizontally from the corresponding vertical edges of the first and second locator members 20a, 20b respectively, so that the ends of the planar body section 22a, 22b can abut the interior surface of the sidewalls 12a, 12b. As a result, the locator members 20a, 20b are more stably positioned on the side walls because that abutment tends to resist any pivoting of the tongues 24a, 24b in the grooves 18 and thus pivoting about a vertical axis of the locator members 20a, 20b. Also, as shown for example in FIG. 3, the pairs of tongues 24a, 24b on the locator members 20a, and 20b respectively are symmetrically disposed relative to the plurality of grooves 28a, 28b.

Figure 4:
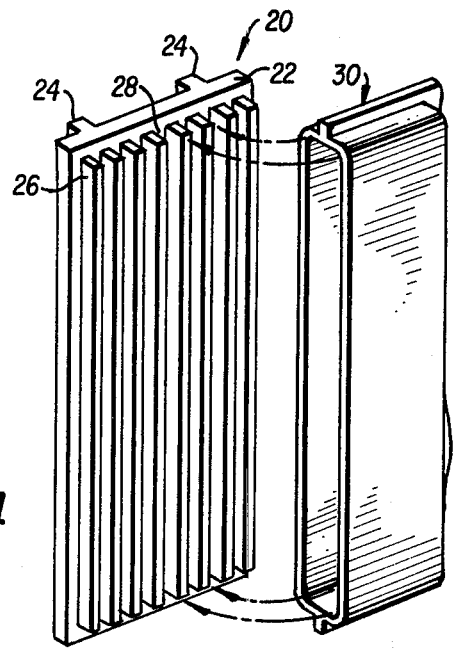
FIG. 4 is a perspective view with the parts disassembled of the locator members and the end of the divider shown in FIG. 1.

The invention also includes a circuit board divider 30 having ends which are positioned in the grooves 28a, 28b and, more particularly, are rectangularly shaped so as to extend completely around a next adjacent pair of the tongues 26a, 26b (FIG. 4). The tongues 26a, 26b are spaced center to center a distance of for example ¼ of an inch. That distance is designated "B" in FIG. 3. A plurality of horizontally equally spaced apart vertically extending grooves 30a, 30b are defined in the opposing faces of the circuit board divider 30. The grooves 30a cooperate with the grooves 18 in the end wall 14a to position and hold circuit boards CB therein as shown in FIG. 1. Likewise, the grooves 30b cooperate with the grooves 18 in the end wall 14b to hold circuit boards CB therebetween.

It should be apparent from the above description of the invention that almost any length circuit board within the length of the box 10 in FIG. 1 may be positioned and securely held in the box. The length of the divider 30 from the end walls may be readily adjusted withou the use of any types of mechanical connectors, such as nuts and bolts or screws, by slidably positioning the locator members 20a, 20b in the grooves 18 in the side walls 12a and 12b, respectively. An overall general length adjustment is obtained by placing the locator members 20a, 20b in the approximate length position desired by appropriately selecting the grooves 18 in the side walls 12a and 12b which would generally accommodate that particular length printed cirucit board CB. Within any position of the locator members on the side walls, the divider 30 may be moved horizontally between the leftmost and rightmost tongues 26a, 26b in FIG. 1 to adjust the divider 30 in for example ¼ inch increments from the grooves 18 in the end wall 14a. With the invention, it is possible to easily and accurately position the divider 30 within for example ¼ inch increments of the end wall 14a. Obviously, the spacing of the tongues 26a, 26b in FIG. 1 could be made as small as desired so that even finer incremental adjustments could be obtained. However, it has been found that adjustments on the order of ¼ or ⅛ inch are satisfactory for adequately accommodating most printed circuit boards.

Shown in FIGS. 5 through 8 is an alternative embodiment of the circuit board divider 30. In this embodiment, the bottom of the grooves 30a, 30b are not spaced the same distance from the central plane of the divider 30 as in the element of FIG. 1. Instead, the bottoms of the grooves 30b are closer to the central plane 34 of the divider 30 than the bottom of the grooves 30a by a relatively small distance of for example ⅛ inch. As a result, by rotating the divider 30 shown in FIGS. 5 through 8, 180° either end to end about a vertical axis or from top to bottom about a horizontal axis, for example from the position shown in FIG. 6 to that shown in FIG. 8, the distance between the bottom of the groove 18 in the end wall 14b and the bottom of the groove of the divider facing that end wall after rotation can be decreased by that smaller distance of for example ⅛ inch. At the same time, the distance of the divider 30 from the other end wall 14a would simultaneously be increased by that ⅛ inch or smaller increment.

Figure 6:
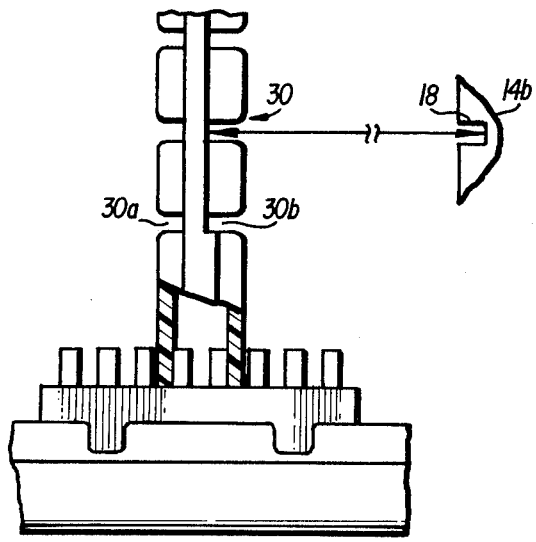
FIGS. 6, 7 and 8 are plan views of the alternative embodiment.
Figure 7:
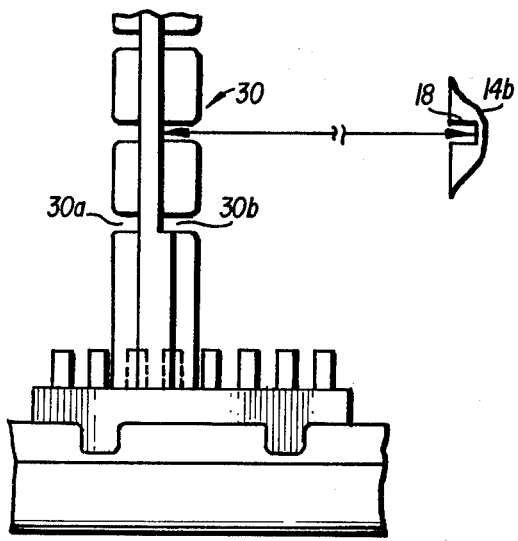
Figure 8:
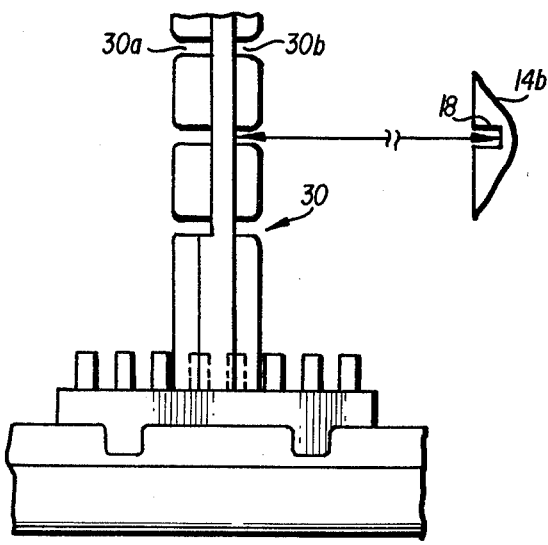

The ¼ inch incremental spacing adjustment is shown for example in FIGS. 6 and 7. When the divider 30 is moved to the left from the position shown in FIG. 6 to that shown in FIG. 7, the divider in FIG. 7 is ¼ inch closer to the end wall 14a and ¼ inch farther from the end wall 14b than in the FIG. 6 position.

The box and its components such as the locator members and the divider may be made of various materials such as wood and plastic, for example polyvinyl chloride.

It is apparent from the above that this invention relates to a tote box for carrying different length printed circuit boards which can be easily adjusted to accommodate different length boards without the necessity of utilizing mechanical bracketing, nuts and bolts, screws, adjustment slots, etc. By placing the divider board on the locator member at the desired position and placing the locator members in the grooves in the sidewalls as desired, the tote box of this invention will accurately and securely hold printed circuit boards of any length within that of the box itself.

Although the invention has been described above with reference to specific preferred embodiments thereof, it will be evident to persons skilled in this art that changes may be made thereto which will lie within the scope of the invention as defined in the following claims.

What I claim is:

1. A tote box for carrying different length circuit boards, said box comprising:
   two opposing side walls;
   two opposing end walls having inwardly opening vertically extending grooves therein;
   means defining a first plurality of horizontally substantially equally spaced apart inwardly opening vertically extending grooves in one of said side walls;
   means defining a second plurality of horizontally substantially equally spaced apart inwardly opening vertically extending grooves in the other of said side walls, each of said second grooves opening toward and being horizontally spaced substantially the same distance from the end walls as a corresponding one of the first grooves;
   a first locator member releasably positionable in any desired one of the first grooves, said member defining a third plurality of horizontally substantially equally spaced apart inwardly opening vertically extending grooves, said third grooves being more closely spaced apart than said first and second grooves;

a second locator member releasably positionable in any desired one of the second grooves, said second member defining a fourth plurality of horizontally substantially equally spaced apart inwardly opening vertically extending grooves, said fourth grooves being spaced fore each other substantially the same distance as said third grooves; and a circuit board divider releasably positionable in any desired one of said third and fourth grooves to extend between said first and second locator members, said divider having a plurality of horizontally spaced vertically extending grooves therein which cooperate with the grooves in the end walls to releasably hold a circuit board therebetween, and the grooves in said divider are in sets positioned on opposite sides thereof facing the end walls, one set having their bottoms closer to the central plane of the divider than the other set by a distance less than the distance between the third grooves whereby the circuit board length accommodating distance between each of the end walls and the divider can be varied by rotating it so that the groove sets each face the other end wall than the one they originally faced before rotation.

2. A tote box for carrying different length circuit boards, said box comprising:

two opposing side walls;

two opposing end walls having inwardly opening vertically extending grooves therein;

a bottom;

means defining a first plurality of horizontally substantially equally spaced apart inwardly opening vertically extending grooves in one of said side walls;

means defining a second plurality of horizontally substantially equally spaced apart inwardly opening vertically extending grooves in the other of said side walls, said first and second plurality of grooves being mirror images of each other relative to a vertical plane parallel to the side walls and positioned midway therebetween;

a first locator member comprising a vertically extending tongue releasably positionable in any desired one of the first grooves and defining a third plurality of horizontally substantially equally spaced apart inwardly opening vertically extending grooves, said third grooves being more closely spaced apart than said first and second grooves;

a second locator member comprising a vertically extending tongue releasably positionable in any desired one of said second grooves corresponding to the first groove in which the first locator member is positioned and defining a fourth plurality of horizontally substantially equally spaced apart inwardly opening vertically extending grooves, said fourth grooves being spaced from each other substantially the same distance as said third grooves, and third and fourth plurality of grooves being mirror images of each other relative to said plane when the locator members are positioned in corresponding ones of the first and second grooves; and a circuit board divider releasably positionable in corresponding ones of the third and fourth grooves to extend between said first and second locator members, said divider having a plurality of horizontally spaced vertically extending grooves therein which cooperate with the grooves in the end walls to releasably hold a circuit board therebetween, and the grooves in said divider are in sets positioned on opposite sides thereof facing the end walls, one set having their bottoms closer to the central plane of the divider than the other set by a distance less than the distance between the third grooves whereby the circuit board length accommodating distance between each of the end walls and the divider can be varied by rotating it so that the groove sets each face the other end wall than the one they originally faced before rotation.

3. A tote box for carrying different length circuit boards, said box comprising:

two opposing side walls;

two opposing end walls having inwardly opening vertically extending grooves therein;

a bottom;

means defining a first plurality of horizontally substantially equally spaced apart inwardly opening vertically extending grooves in one of said side walls;

means defining a second plurality of horizontally substantially equally spaced apart inwardly opening vertically extending grooves in the other of said side walls, said first and second plurality of grooves being mirror images of each other relative to a vertical plane parallel to the side walls and positioned midway therebetween;

a first locator member comprising:

a planar body section having opposing faces, one of which is adapted to abut the interior side of one of the side walls;

a pair of vertically extending first tongues projecting from one face of the body section and releasably positionable in any next adjacent pair of the first grooves; and a plurality of vertically and inwardly extending substantially equally horizontally spaced apart second tongues projecting from the other face of the body section, said second tongues defining a third plurality of horizontally substantially equally spaced apart inwardly opening vertically extending grooves, said third grooves being more closely spaced apart than said first and second grooves;

a second locator member comprising:

a planar second body section having opposing faces, one of which is adapted to abut the interior side of the other of said side walls;

a pair of vertically extending third tongues projecting from the one face of the second body section and releasably positionable in any next adjacent pair of the second grooves corresponding to the first grooves in which the first tongues are positioned; and a plurality of vertically and inwardly extending substantially equally and horizontally spaced apart fourth tongues projecting from the other face of the second body section, said fourth tongues defining a fourth plurality of horizontally substantially equally spaced apart inwardly opening vertically extending grooves, said fourth grooves being spaced from each other substantially the same distance as said third grooves, said third and fourth plurality of grooves being mirror images of each other relative to said plane when the locator members are positioned in corresponding ones of the first and second grooves; and a circuit board divider releasably positionable in corresponding ones of the third and fourth grooves to extend between said first and second locator members, said divider having a plurality of horizontally spaced vertically extending grooves therein which cooperate with the grooves in the end walls to releasably hold a circuit board therebetween, and the grooves in said divider are in sets positioned on opposite sides thereof facing the end walls, one set having their bottoms closer to the central plane of the divider than the other set by a distance less than the distance between the third grooves whereby the circuit board length accommodating distance between each of the end walls and the divider can be varied by rotating it so that the groove sets each face the other end wall than the one they originally faced before rotation.

4. A tote box for carrying different length circuit boards as claimed in claim 3, wherein:
said body section of each of said first and second locator members is substantially rectangular with vertical and horizontal edges; and
each of said pair of first and third tongues is spaced horizontally from the corresponding vertical edges of the first and second locator members respectively.

5. A tote box for carrying different length circuit boards as claimed in claim 4, wherein:
the pair of first tongues and the pair of third tongues are symmetrically disposed relative to the third and fourth plurality of grooves respectively.

* * * * *